US010734266B2

(12) United States Patent
Miyamoto

(10) Patent No.: US 10,734,266 B2
(45) Date of Patent: Aug. 4, 2020

(54) SUBSTRATE TRANSPORTER AND SUBSTRATE TRANSPORT METHOD

(71) Applicant: SCREEN Holdings Co., Ltd., Kyoto (JP)

(72) Inventor: Yukiteru Miyamoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 163 days.

(21) Appl. No.: 15/693,717

(22) Filed: Sep. 1, 2017

(65) Prior Publication Data
US 2018/0090356 A1 Mar. 29, 2018

(30) Foreign Application Priority Data

Sep. 29, 2016 (JP) ................. 2016-190861

(51) Int. Cl.
H01L 21/68 (2006.01)
H01L 21/677 (2006.01)
H01L 21/687 (2006.01)
H01L 21/67 (2006.01)

(52) U.S. Cl.
CPC .. *H01L 21/67718* (2013.01); *H01L 21/67253* (2013.01); *H01L 21/67288* (2013.01);
(Continued)

(58) Field of Classification Search
CPC ................................ H01L 21/67288
See application file for complete search history.

(56) References Cited

U.S. PATENT DOCUMENTS

2009/0010748 A1 1/2009 Kamikawa et al.
2010/0068014 A1 3/2010 Mitsuyoshi et al. ..... 414/225.01
(Continued)

FOREIGN PATENT DOCUMENTS

JP 09-162261 6/1997
JP 2000-306970 A 11/2000
(Continued)

OTHER PUBLICATIONS

Korean Notice of Allowance dated Dec. 13, 2019 in connection with Korean Patent Application No. 10-2017-0108539.
(Continued)

*Primary Examiner* — Timothy R Waggoner
(74) *Attorney, Agent, or Firm* — Ostrolenk Faber LLP

(57) ABSTRACT

In a substrate transporter, a carry-in-and-out mechanism transports a substrate placed in a horizontal posture. A notch aligner rotates a substrate in a circumferential direction to change a circumferential position of a notch. The carry-in-and-out mechanism includes four supporters that oppose a lower surface of the peripheral portion of the substrate. In the substrate transporter, a controller controls the notch aligner on the basis of warpage-and-notch-position information and input information that is input about the warped state of the substrate, to determine the circumferential position of the notch of the substrate. Thus, the lower surface of the substrate placed on the transport mechanism comes into contact with the four supporters of the transport mechanism. As a result, it is possible to prevent or suppress the occurrence of rattling or misalignment of the substrate during transport by the transport mechanism, and enables stable transport of the substrate.

7 Claims, 8 Drawing Sheets

(52) U.S. Cl.
CPC .. *H01L 21/67742* (2013.01); *H01L 21/67766* (2013.01); *H01L 21/67781* (2013.01); *H01L 21/68* (2013.01); *H01L 21/68707* (2013.01)

(56) References Cited

U.S. PATENT DOCUMENTS

| | | | |
|---|---|---|---|
| 2010/0282956 A1 | 11/2010 | Kimba et al. | 250/252.1 |
| 2012/0257176 A1 | 10/2012 | Hayashi | 355/27 |
| 2013/0293864 A1 | 11/2013 | Hirano | |
| 2017/0178930 A1* | 6/2017 | Onzuka | H01L 21/30604 |

FOREIGN PATENT DOCUMENTS

| | | |
|---|---|---|
| JP | 2006-339574 A | 12/2006 |
| JP | 2007-067334 A | 3/2007 |
| JP | 2007-123592 A | 5/2007 |
| JP | 2010-093230 A | 4/2010 |
| JP | 2011-035377 A | 2/2011 |
| JP | 2013-013945 A | 1/2013 |
| JP | 2013-258312 A | 12/2013 |
| JP | 2014-063880 A | 4/2014 |
| KR | 10-2012-0115938 | 10/2012 |
| TW | 201403023 A | 1/2014 |

OTHER PUBLICATIONS

Office Action dated Mar. 12, 2020 in connection with Japanese Patent Application No. 2016-190861.

* cited by examiner

SUBSTRATE TRANSPORTER AND SUBSTRATE TRANSPORT METHOD

TECHNICAL FIELD

The present invention relates to a technique for transporting substrates.

BACKGROUND ART

Substrate processing apparatuses that perform various types of processing on substrates have conventionally been used in the process of manufacturing semiconductor substrates (hereinafter, simply referred to as "substrates"). For example, Japanese Patent Application Laid-Open No. 2010-93230 (Document 1) discloses a batch-type substrate processing apparatus that processes a plurality of substrates by one operation. In this substrate processing apparatus, a plurality of substrates aligned along the thickness (hereinafter, referred to as a "thickness direction") of the substrates in a horizontal posture are held and transported by a batch hand. This substrate processing apparatus includes a substrate-direction alignment mechanism for aligning the directions of a plurality of substrates that are held in a vertical posture by a chuck. The substrate-direction alignment mechanism aligns a plurality of substrates at once so that the orientations (i.e., circumferential positions) of notches provided in peripheral portions of the substrates match one another.

A substrate processing apparatus disclosed in Japanese Patent Application Laid-Open No. 2013-258312 (Document 2) includes a notch alignment device that aligns the positions of notches by individually picking up substrates one at a time. This substrate processing apparatus determines the destination to which the substrates are transported by a robot, on the basis of information such as notch alignment progress information that indicates whether notch alignment is completed, and processing progress information that indicates whether processing to be performed on substrates is completed.

Meanwhile, a substrate inspection device disclosed in Japanese Patent Application Laid-Open No. 2006-339574 (Document 3) includes a transport arm that transports a wafer while adsorbing the lower surface of the wafer under vacuum. If the wafer is warped, in order to prevent misdetection of imperfect wafer adsorption by the transport arm, the substrate inspection apparatus changes a threshold value for vacuum pressure in accordance with the amount of warp in the wafer, the threshold value being used to judge the imperfect adsorption. If the adsorptive activity of the transport arm decreases due to a change in the threshold value, the wafer transport speed is reduced in order to prevent the wafer to be displaced during transport.

When substrates in a horizontal posture are supported from the underside by a batch hand without being adsorbed as in the substrate processing apparatus in Document 1 and if these substrates are warped, the substrates may rattle (e.g., may shake or be displaced in the direction of transport), and this makes it difficult to stably support and transport the substrates.

SUMMARY OF INVENTION

The present invention is intended for a substrate transporter, and it is an object of the present invention to stably transport substrates. The present invention is also intended for a substrate transport method.

A substrate transporter according to the present invention includes a transport mechanism for transporting a substrate that is placed in a horizontal posture, a notch-position changing mechanism for rotating the substrate that is to be placed on the transport mechanism, in a circumferential direction to change a position in the circumferential direction of a notch that is provided in a peripheral portion of the substrate, a storage for storing warpage-and-notch-position information that includes a plurality of combinations of a warped state of the substrate and a notch position at which the substrate in the warped state is held in a proper posture when placed on the transport mechanism, and a controller for controlling the notch-position changing mechanism. The transport mechanism includes four supporters that oppose a lower surface of the peripheral portion of the substrate. The lower surface of the substrate that is placed on the transport mechanism and the four supporters of the transport mechanism are brought into contact with each other by the controller controlling the notch-position changing mechanism on the basis of the warpage-and-notch-position information and input information that is input about the warped state of the substrate to determine the position in the circumferential direction of the notch of the substrate. This substrate transporter is capable of stably transporting substrates.

In a preferred embodiment of the present invention, the transport mechanism includes two hand elements, on each of which two supporters among the four supporters are provided, and the substrate that is placed on the transport mechanism is convex upward between the two supporters of each hand element and vertically upward of each hand element.

In another preferred embodiment of the present invention, the transport mechanism transports another substrate along with the substrate, the notch-position changing mechanism rotates the another substrate and the substrate either sequentially or simultaneously in the circumferential direction to determine a position in the circumferential direction of a notch that is provided in a peripheral portion of the another substrate, in the same manner as in the case of the substrate, the transport mechanism includes another four supporters that oppose a lower surface of the peripheral portion of the another substrate, and the lower surface of the another substrate that is placed on the transport mechanism comes into contact with the another four supporters of the transport mechanism.

Another substrate transporter according to the present invention includes a transport mechanism for transporting a substrate that is placed in a horizontal posture, and a controller for controlling the transport mechanism on the basis of a warped state of the substrate to control acceleration at a time of starting and stopping movement of the transport mechanism. This substrate transporter is capable of stably transporting substrates.

In the aforementioned substrate transporter, for example, the substrate is curved in a first radial direction to one side in a thickness direction of the substrate with a first curvature, and the substrate is curved in a second radial direction orthogonal to the first radial direction to the one side in the thickness direction with a second curvature greater than the first curvature.

In the aforementioned substrate transporter, for example, the substrate is curved in a first radial direction to one side in a thickness direction of the substrate, and the substrate is curved in a second radial direction orthogonal to the first radial direction to the other side in the thickness direction.

These and other objects, features, aspects and advantages of the present invention will become more apparent from the following detailed description of the present invention when taken in conjunction with the accompanying drawings.

DESCRIPTION OF EMBODIMENTS

Figure 1:
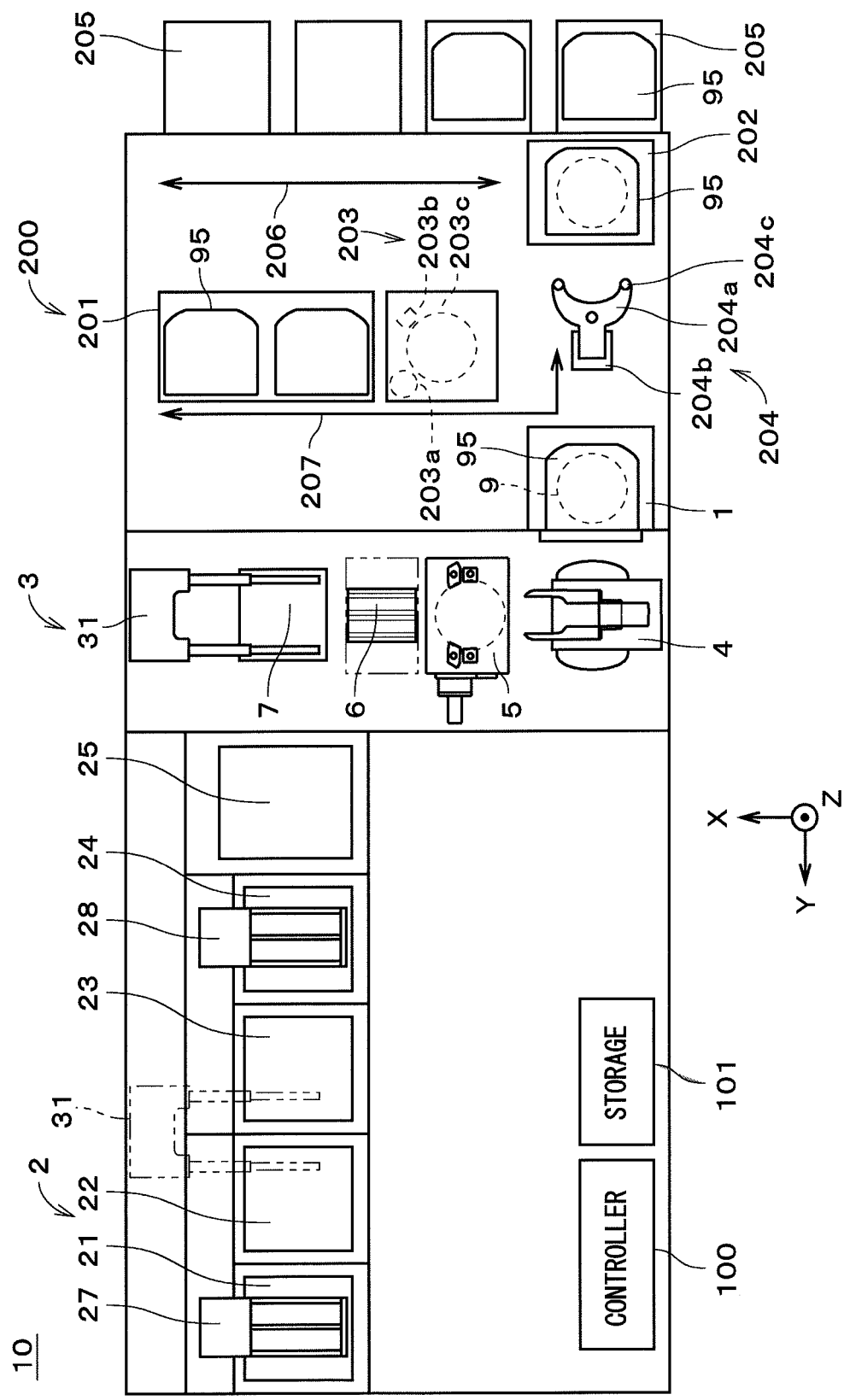
FIG. 1 is a plan view of a substrate processing apparatus according to an embodiment.

FIG. 1 is a plan view of a substrate processing apparatus 10 according to an embodiment of the present invention. The substrate processing apparatus 10 has an approximately rectangular shape in plan view. The substrate processing apparatus 10 is a batch-type substrate processing apparatus that processes a plurality of semiconductor substrates 9 (hereinafter, simply referred to as "substrates 9") by one operation. The substrates 9 are approximately disc-like substrates. Each substrate 9 has a notch 93 (see FIGS. 4 and 5) indicating a crystal orientation in a peripheral portion. The notch 93 has a depth of approximately 1 mm from the outer periphery of the substrate 9.

The substrate processing apparatus 10 includes a FOUP holder 1, a substrate processing part 2, a main transport mechanism 3, a carry-in-and-out mechanism 4, a posture changing mechanism 5, a pusher 6, a delivery mechanism 7, a stocker 200, a controller 100, and a storage 101. The controller 100 controls operations or other activities of each constituent element of the substrate processing apparatus 10. The controller 100 is a general computer system that includes, for example, a CPU for performing various types of computations, a ROM for storing basic programs, and a RAM for storing various types of information. The FOUP holder 1 is disposed adjacent to the carry-in-and-out mechanism 4. The FOUP holder 1 holds a FOUP 95. The FOUP 95 is a container that houses a plurality of (e.g., 25) substrates 9 in a horizontal posture, with the substrates 9 being stacked in the Z direction.

The Z direction in FIG. 1 is a direction parallel to the direction of gravity, and is also referred to as an "up-down direction." The X direction in FIG. 1 is a direction perpendicular to the Z direction. The Y direction is a direction perpendicular to the X and Y directions. A horizontal posture of the substrates 9 refers to a posture in which the direction of the normal to the main surfaces of the substrates 9 points in approximately the Z direction. A vertical posture of the substrates 9, which will be described later, refers to a posture in which the direction of the normal to the main surfaces of the substrates 9 points in a direction approximately perpendicular to the Z direction. In the substrate processing apparatus 10, a plurality of substrates 9 are stacked in either a horizontal or vertical posture in a direction approximately perpendicular to the main surfaces of the substrates 9. In other words, the plurality of substrates 9 in a horizontal or vertical posture are aligned in the thickness direction of the substrates 9.

The stocker 200 is disposed on the −Y side of and adjacent to the FOUP holder 1. The stocker 200 includes a FOUP stock part 201, a FOUP placement area 202, a notch aligner 203, a substrate transport robot 204, a FOUP holder 205, a first FOUP transfer robot 206, and a second FOUP transfer robot 207. The FOUP stock part 201 supports a plurality of FOUPs 95, which are arranged two-dimensionally in X and Y directions, from the underside. The FOUPs 95 are to be placed on the FOUP placement area 202.

The notch aligner 203 carries out notch alignment, which will be described later, by rotating a substrate 9 held in a horizontal posture in a circumferential direction. In other words, the notch aligner 203 changes the circumferential orientation of a substrate 9 by rotating the substrate 9 in the circumferential direction, and determines the circumferential position of the substrate 9. The notch aligner 203 includes a substrate supporter 203c, a motor 203a, and a notch position sensor 203b. The substrate supporter 203c rotatably supports a substrate 9 held in a horizontal posture. The motor 203a is a rotator that rotates a substrate 9 along with the substrate supporter 203c. The notch position sensor 203b acquires the angular position of a rotating substrate 9 (i.e., circumferential orientation of the substrate 9) by optically detecting the notch 93 (see FIGS. 4 and 5) of the substrate 9 supported by the substrate supporter 203c.

The substrate transport robot 204 transports substrates 9 one at a time between the FOUP 95 placed on the FOUP placement area 202 and the notch aligner 203. The FOUP holder 205 holds a FOUP 95 that is to be conveyed into the internal space of the stocker 200. The first FOUP transfer robot 206 transfers a FOUP 95 to and from the FOUP stock part 201, the FOUP placement area 202, and the FOUP holder 205. The second FOUP transfer robot 207 transfers a FOUP 95 to and from the FOUP stock part 201, the FOUP placement area 202, and the FOUP holder 1. Note that only the paths of travel of the first FOUP transfer robot 206 and the second FOUP transfer robot 207 are illustrated in schematic form in FIG. 1.

In the stocker 200, when a new FOUP 95 is placed on the FOUP placement area 202, the first FOUP transfer robot 206 transports this FOUP 95 to the FOUP stock part 201. The second FOUP transfer robot 207 moves a new FOUP 95 that holds unprocessed substrates 9 from the FOUP stock part 201 to the FOUP holder 1 in accordance with a schedule of processing performed by the substrate processing apparatus 10. The second FOUP transfer robot 207 also moves a FOUP 95 that has undergone processing performed by the substrate processing apparatus 10 from the FOUP holder 1 to the FOUP stock part 201.

The substrate transport robot 204 includes an arm 204a, an arm drive mechanism 204b, and substrate abutment parts 204c. The arm drive mechanism 204b rotates, extends, and contracts the arm 204a. The substrate abutment parts 204c are provided on the arm 204a and support a substrate 9 in point contact with the lower surface of the substrate 9. The upper surface of the arm 204a has three substrate abutment parts 204.

The substrate transport robot 204 rotates, extends, and contracts the arm 204a, takes a single substrate 9 out of the FOUP 95 that is placed on the FOUP placement area 202, and turns in the X direction to face the notch aligner 203. The substrate transport robot 204 then elongates the arm 204a and places the taken-out substrate 9 on the substrate supporter 203c of the notch aligner 203.

In the notch aligner 203, the motor 203a rotates the substrate 9 supported by the substrate supporter 203c in the circumferential direction to change the circumferential orientation of the substrate 9. Then, the notch position sensor 203b detects the notch 93 of the rotating substrate 9, and the motor 203a is stopped with predetermined timing after the detection (i.e., after the elapse of a predetermined period of time since the detection of the notch 93). Note that the predetermined period of time may be zero. In this way, the rotation of the substrate 9 is stopped when the notch 93 of the substrate 9 is located at a predetermined position. That is, the notch 93 of the substrate 9 is aligned in the circumferential direction. The notch aligner 203 is a notch-position changing mechanism for changing the circumferential position of the notch 93 of the substrate 9.

When the notch aligner 203 has determined the circumferential position of the substrate 9, the substrate 9 is transported out of the notch aligner 203 by the substrate transport robot 204 and returned to the FOUP 95 placed on the FOUP placement area 202. Subsequently, in the same manner, the next substrate 9 is taken out of the FOUP 95 placed on the FOUP placement area 202 and then returned to the FOUP 95 after the notch aligner 203 has determined the circumferential position of the substrate 9 (i.e., the notch 93 is aligned in the circumferential direction). By repeating this operation for all of the substrates 9 in the FOUP 95, the circumferential orientations of the plurality of substrates 9 in the FOUP 95 are changed, and the circumferential positions of the substrates 9 are determined. In other words, these substrates 9 are aligned in the circumferential direction. The FOUP 95 for which the substrates 9 housed therein have been aligned in the circumferential direction is transported to the FOUP holder 1 by the second FOUP transfer robot 207.

Figure 2:
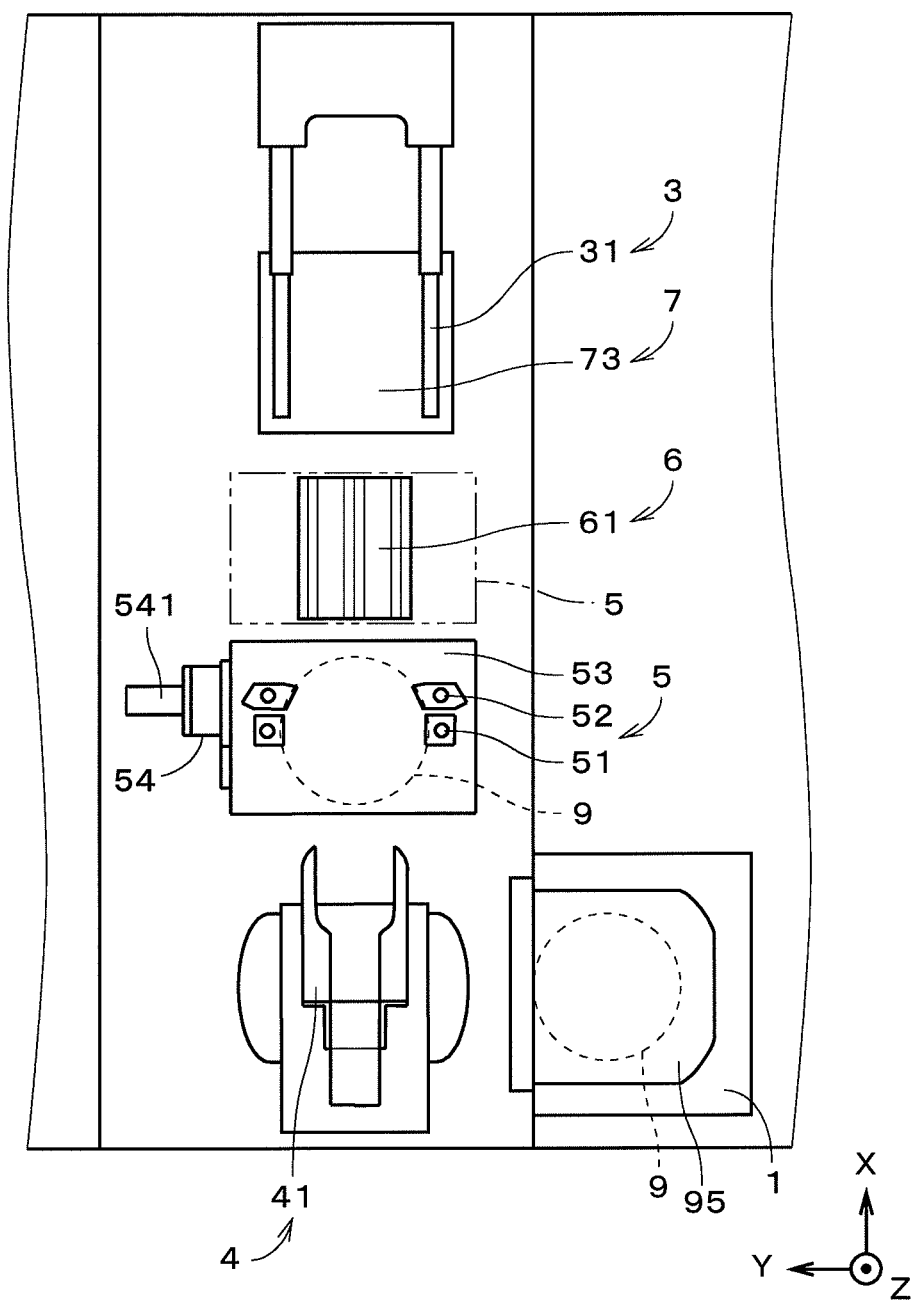
FIG. 2 is a plan view of part of the substrate processing apparatus.
Figure 3:
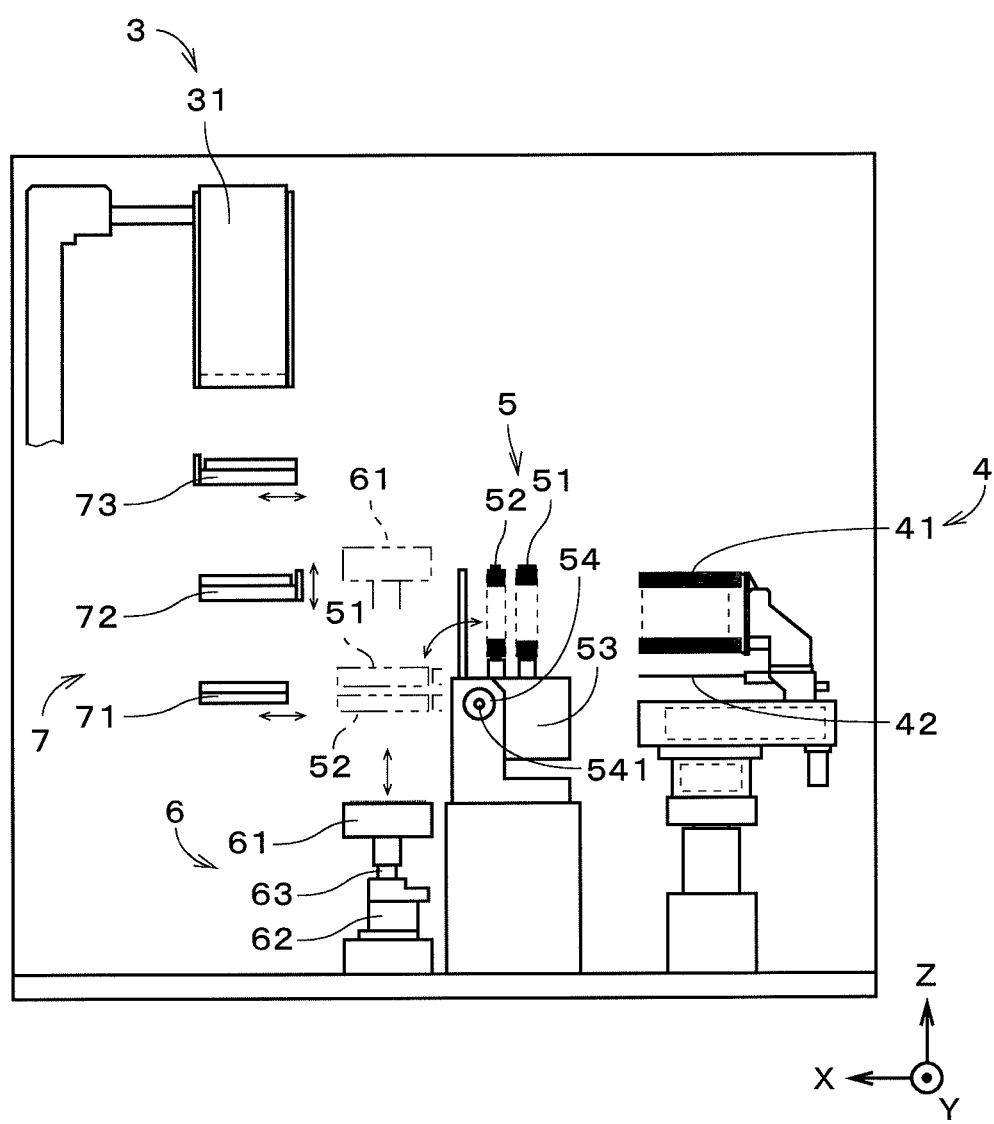
FIG. 3 is a side view of part of the substrate processing apparatus.

FIG. 2 is an enlarged plan view of part of the substrate processing apparatus 10. FIG. 3 is a side view of part of the substrate processing apparatus 10. In the substrate processing apparatus 10, the carry-in-and-out mechanism 4 is disposed on the +Y side of the FOUP holder 1 and opposes the FOUP holder 1 in the Y direction as illustrated in FIG. 2. The FOUP holder 1 is not shown in FIG. 3.

As illustrated in FIGS. 2 and 3, the posture changing mechanism 5 is disposed on the +X side of the carry-in-and-out mechanism 4. The pusher 6 is disposed on the +X side of the posture changing mechanism 5. The delivery mechanism 7 and the main transport mechanism 3 are disposed on the +X side of the pusher 6. In the state illustrated in FIG. 3, the main transport mechanism 3 is located on the +Z side of (i.e., above) the delivery mechanism 7. The substrate processing part 2 is disposed on the +Y side of the main transport mechanism 3 as illustrated in FIG. 1.

The substrate processing part 2 includes a first liquid chemical tank 21, a first rinsing liquid tank 22, a second liquid chemical tank 23, a second rinsing liquid tank 24, a dry processing part 25, a first lifter 27, and a second lifter 28. The first liquid chemical tank 21, the first rinsing liquid tank 22, the second liquid chemical tank 23, the second rinsing liquid tank 24, and the dry processing part 25 are aligned in the Y direction from the +Y side to the −Y side in the specified order. The first liquid chemical tank 21 and the second liquid chemical tank 23 retain liquid chemicals of the same type or different types. The first rinsing liquid tank 22 and the second rinsing liquid tank 24 each retain a rinsing liquid (e.g., deionized water).

When the substrate processing apparatus 10 processes substrates 9, first, a plurality of (e.g., 25) substrates 9 housed in a horizontal posture in the FOUP 95 placed on the FOUP holder 1 are held by a batch hand 41 of the carry-in-and-out mechanism 4 illustrated in FIGS. 2 and 3 and conveyed out of the FOUP 95. The batch hand 41 collectively holds a plurality of substrates 9 that are aligned in the Z direction in a horizontal posture. The carry-in-and-out mechanism 4 also includes a single-substrate hand 42 that holds a single substrate 9 in a horizontal posture.

Then, the batch hand 41 rotates horizontally and moves ahead toward the posture changing mechanism 5 so that the plurality of substrates 9 are transferred from the carry-in-and-out mechanism 4 to the posture changing mechanism 5. The posture changing mechanism 5 collectively holds the plurality of substrates 9, which are stacked in the Z direction in a horizontal posture, with a horizontal holder 51. The posture changing mechanism 5 causes a holder rotation mechanism 54 to rotate the plurality of substrates 9 by 90 degrees in the counterclockwise direction in FIG. 3 about a rotational shaft 541 pointing in the Y direction, along with the horizontal holder 51, a vertical holder 52, and a mounting block 53. This rotation changes the posture of the substrates 9 at once from horizontal to vertical. The substrates 9 in a vertical posture are collectively held by the vertical holder 52.

Then, an up-and-down holder 61 is moved upward by driving a holder elevating mechanism 62 of the pusher 6, and receives and holds the substrates 9 from the vertical holder 52 indicated by the dashed double-dotted line in FIG. 3. That is, the substrates 9 held in a vertical posture are transferred between the vertical holder 52 and the pusher 6. The up-and-down holder 61 collectively holds the substrates 9 that are aligned (i.e., stacked) in approximately the X direction in a vertical posture. When the horizontal holder 51 and the vertical holder 52 of the posture changing mechanism 5 are rotated by 90 degrees in the clockwise direction in FIG. 3 and retracted from above the holder elevating mechanism 62, the up-and-down holder 61 is rotated horizontally by 180 degrees about a rotational shaft 63 pointing in the Z direction and then moved down by the holder elevating mechanism 62. Accordingly, the positions in the stacking direction of the substrates 9 are shifted by a half of the pitch of the substrates 9 (i.e., a half of the distance in the stacking direction between two adjacent substrates 9, which is hereinafter referred to as a "half pitch") from the positions before the rotation.

Thereafter, in the same procedure as described above, a new plurality of (e.g., 25) substrates 9 housed in the FOUP 95 on the FOUP holder 1 are transferred from the carry-in-and-out mechanism 4 to the posture changing mechanism 5. The posture changing mechanism 5 collectively changes the posture of the new substrates 9 from horizontal to vertical. Then, the up-and-down holder 61 of the pusher 6 is again moved upward and receives and holds the new substrates 9 from the posture changing mechanism 5. At this time, the substrates 9 already held by the up-and-down holder 61 (hereinafter, referred to as a "first substrate group") are inserted among the new substrates 9 (hereinafter, referred to as a "second substrate group") from the underside. In this way, the posture changing mechanism 5 and the pusher 6 carry out batch assembly in which a batch is formed by combining the first substrate group and the second substrate group.

As described above, the substrates 9 (hereinafter, also referred to as "first substrates 9") in the first substrate group are rotated by 180 degrees (i.e., turned around) before insertion into the second substrate group. Thus, each of the first substrates 9 in the first substrate group is disposed between each pair of the substrates 9 (hereinafter, also referred to as "second substrates 9") in the second substrate group, with the first substrates 9 and the second substrates 9 alternately arranged front-to-front and back-to-back. In other words, each pair of adjacent substrates 9 among the plurality of (e.g., 50) substrates 9 held by the up-and-down holder 61 are disposed such that their front surfaces or their rear surfaces face each other (i.e., they are in a face-to-face situation). The front surfaces of the substrates 9 may be main surfaces where circuit patterns are formed, and the rear surfaces of the substrates 9 may be main surfaces on the side opposite to the front surfaces.

Alternatively, when the up-and-down holder 61 that holds the first substrate group is moved only horizontally by the half pitch in the alignment direction of the substrates 9 without being rotated by 180 degrees before receipt of the second substrate group, the pusher 6 may carry out batch assembly in a state in which each pair of adjacent substrates 9 is disposed such that their front and rear surfaces face each other (i.e., they are in a face-to-back situation).

The substrates 9 assembled into a batch on the up-and-down holder 61 are transferred from the up-and-down holder 61 to a carry-in chuck 71 of the delivery mechanism 7. The carry-in chuck 71 moves in the +X direction from above the holder elevating mechanism 62 while holding the received substrates 9 in a vertical posture. Subsequently, an intermediate chuck 72 of the delivery mechanism 7 moves downward to receive the substrates 9 from the carry-in chuck 71 and then moves upward. Then, a substrate chuck 31 of the main transport mechanism 3 receives the substrates 9 from the intermediate chuck 72. The substrate chuck 31 holds the substrates 9 that are aligned in the X direction in a vertical posture.

The main transport mechanism 3 transports the unprocessed substrates 9 held by the substrate chuck 31 in the +Y direction and positions the substrates 9 above the first lifter 27 of the substrate processing part 2 illustrated in FIG. 1. The first lifter 27 collectively receives the substrates 9, which are aligned in the X direction in a vertical posture, from the substrate chuck 31. The first lifter 27 moves the substrates 9 down into the first liquid chemical tank 21 and collectively immerses the substrates 9 in the liquid chemical retained in the first liquid chemical tank 21. Immersing the substrates 9 in the liquid chemical for a predetermined period of time completes liquid chemical processing performed on the substrates 9.

The first lifter 27 then pulls the substrates 9 up out of the first liquid chemical tank 21 and moves in the −Y direction. The first lifter 27 moves the substrates 9 down into the first rinsing liquid tank 22 and collectively immerses the substrates 9 in the rinsing liquid retained in the first rinsing liquid tank 22. Immersing the substrates 9 in the rinsing liquid for a predetermined period of time completes rinsing processing performed on the substrates 9. After the rinsing processing has completed, the first lifter 27 pulls the substrates 9 up out of the first rinsing liquid tank 22. The substrate chuck 31 of the main transport mechanism 3 collectively receives the substrates 9 from the first lifter 27 and moves to above the second lifter 28.

Like the first lifter 27, the second lifter 28 collectively receives the substrates 9 from the substrate chuck 31 and collectively immerses the substrates 9 in the liquid chemical retained in the second liquid chemical tank 23. After the liquid chemical processing performed on the substrates 9 has completed, the second lifter 28 pulls the substrates 9 up out of the second liquid chemical tank 23 and collectively immerses the substrates 9 in the rinsing liquid retained in the second rinsing liquid tank 24. After the rinsing processing performed on the substrates 9 has completed, the second lifter 28 pulls the substrates 9 up out of the second rinsing liquid tank 24. The substrate chuck 31 of the main transport mechanism 3 collectively receives the substrates 9 from the second lifter 28 and moves to above the dry processing part 25.

The dry processing part 25 collectively receives the substrates 9 from the substrate chuck 31 and performs dry processing on the substrates 9 at once. The dry processing involves, for example, supplying an organic solvent (i.e., isopropyl alcohol) to the substrates 9 in a reduced-pressure atmosphere and rotating the substrates 9 to remove the liquids on the substrates 9 by centrifugal force. After the dry processing performed on the substrates 9 has completed, the substrate chuck 31 of the main transport mechanism 3 collectively receives the processed substrates 9 from the dry processing part 25 and moves in the −Y direction.

Then, a delivery chuck 73 of the delivery mechanism 7 illustrated in FIGS. 2 and 3 collectively receives the substrates 9 from the substrate chuck 31 of the main transport mechanism 3 and moves in the −X direction to position the substrates 9 above the up-and-down holder 61 of the pusher 6. The up-and-down holder 61 of the pusher 6 moves upward and receives the substrates 9 from the delivery chuck 73. The up-and-down holder 61 holds the plurality of (e.g., 50) substrates 9 aligned in the X direction in a vertical posture.

Next, the up-and-down holder 61 moves downward to transfer the substrates 9 in a vertical posture between the pusher 6 and the vertical holder 52. More specifically, among the substrates 9, the plurality of (e.g., 25) substrates 9 in the second substrate group are transferred to the vertical holder 52 indicated by the dashed double-dotted line in FIG. 3. In other words, the batch of the first substrate group and the second substrate group is disassembled, and the first substrate group and the second substrate group are separated from each other. The horizontal holder 51 and the vertical holder 52 of the posture changing mechanism 5 are rotated by 90 degrees in the clockwise direction in FIG. 3. This rotation changes the posture of the substrates 9 in the second substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95 on the FOUP holder 1. The FOUP 95 to which the processed substrates 9 are carried is replaced by a new FOUP 95.

When the posture changing mechanism 5 has changed the posture of the substrates 9 in the second substrate group from vertical to horizontal as described above, the up-and-down holder 61 that holds the plurality of (e.g., 25) substrates 9 in the first substrate group is moved upward. The horizontal holder 51 and the vertical holder 52 that have transferred the substrates 9 in the second substrate group to the carry-in-and-out mechanism 4 are rotated by 90 degrees in the counterclockwise direction in FIG. 3.

Then, the up-and-down holder 61 is again moved downward to transfer the substrates 9 in a vertical posture between the pusher 6 and the vertical holder 52. More specifically, the substrates 9 in the first substrate group are transferred to the vertical holder 52 indicated by the dashed double-dotted line in FIG. 3. The horizontal holder 51 and the vertical holder 52 are again rotated by 90 degrees in the clockwise direction in FIG. 3. This rotation changes the posture of the substrates 9 in the first substrate group at once from vertical to horizontal. These substrates 9 are collectively held by the horizontal holder 51 while being stacked in the Z direction in a horizontal posture. Then, the batch hand 41 of the carry-in-and-out mechanism 4 receives the substrates 9 from the horizontal holder 51 and carries the substrates 9 into the FOUP 95. Note that the posture changing mechanism 5 may first receive the first substrate group and then receive the second substrate group in the operation of moving the substrates 9 from the pusher 6 to the posture changing mechanism 5.

The posture changing mechanism 5 and the pusher 6 change the posture of the substrates 9 from horizontal to vertical or from vertical to horizontal as described above under the control of the controller 100. In other words, the posture changing mechanism 5, the pusher 6, and the controller 100 constitute a posture changing device that changes the posture of the substrates 9 from one of horizontal and vertical postures to the other posture.

While the substrate processing apparatus 10 illustrated in FIGS. 1 to 3 performs processing on the substrates 9 having an approximately disc-like shape as described above, these substrates 9 may be warped under the influence of processing (i.e., pre-processing) performed before transport to the substrate processing apparatus 10. Although various types of warpage may occur in the substrates 9, a plurality of substrates 9 housed in a single FOUP 95 are generally warped in the same way. More specifically, when the positions of the notches 93 are used as a reference, the substrates 9 are in the same warped state. The warped state of the substrates 9 indicates information including the orientation of the warp in the substrates 9 (e.g., orientation in which the substrate is convex to the front surface side) and the magnitude of the warp in the substrates 9.

Figure 4:
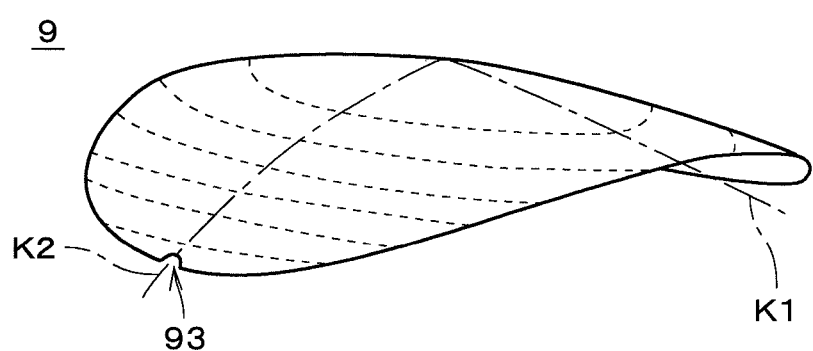
FIG. 4 is a perspective view of a substrate.
Figure 5:
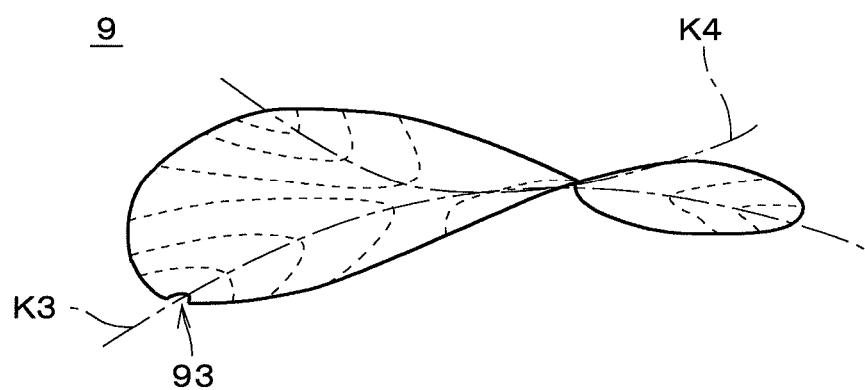
FIG. 5 is a perspective view of a substrate.

FIGS. 4 and 5 are perspective views illustrating examples of substrates 9 in different warped states. The substrate 9 in FIG. 4 is curved in a first radial direction K1 to one side in the thickness direction (i.e., direction in which the substrate is convex upward in FIG. 4) with a first curvature. The substrate 9 in FIG. 4 is also curved in a second radial direction K2 orthogonal to the first radial direction K1 to the one side in the thickness direction (i.e., the same direction as the direction of the curve in the first radial direction K1) with a second curvature greater than the first curvature.

The substrate 9 in FIG. 5 is curved in a first radial direction K3 to one side in the thickness direction (i.e., direction in which the substrate is convex upward in FIG. 5). The first radial direction K3 may be different from the first radial direction K1 illustrated in FIG. 4. The substrate 9 in FIG. 5 is also curved in a second radial direction K4 orthogonal to the first radial direction K3 to the other side in the thickness direction (i.e., direction opposite to the direction of the curve in the first radial direction K3).

In the following description, the warped states of the substrates 9 illustrated in FIGS. 4 and 5 are also respectively referred to as a "first warped state" and a "second warped state." The distance in the thickness direction between lowest and highest points in the thickness direction of each warped substrate 9 in a horizontal posture is referred to as the "size in the thickness direction" of the substrate 9. When the substrate 9 is held in a vertical posture, the size in the thickness direction of the substrate 9 is equal to the distance in the thickness direction between the point of the substrate 9 closest to the one side in the thickness direction and the point of the substrate 9 closest to the other side in the thickness direction. When the substrate 9 is flat and not warped, the size in the thickness direction of the substrate 9 is the same as the thickness of the substrate 9. The size in the thickness direction of a warped substrate 9 may be greater by approximately 0.5 mm than the thickness of a flat substrate 9.

Figure 6:
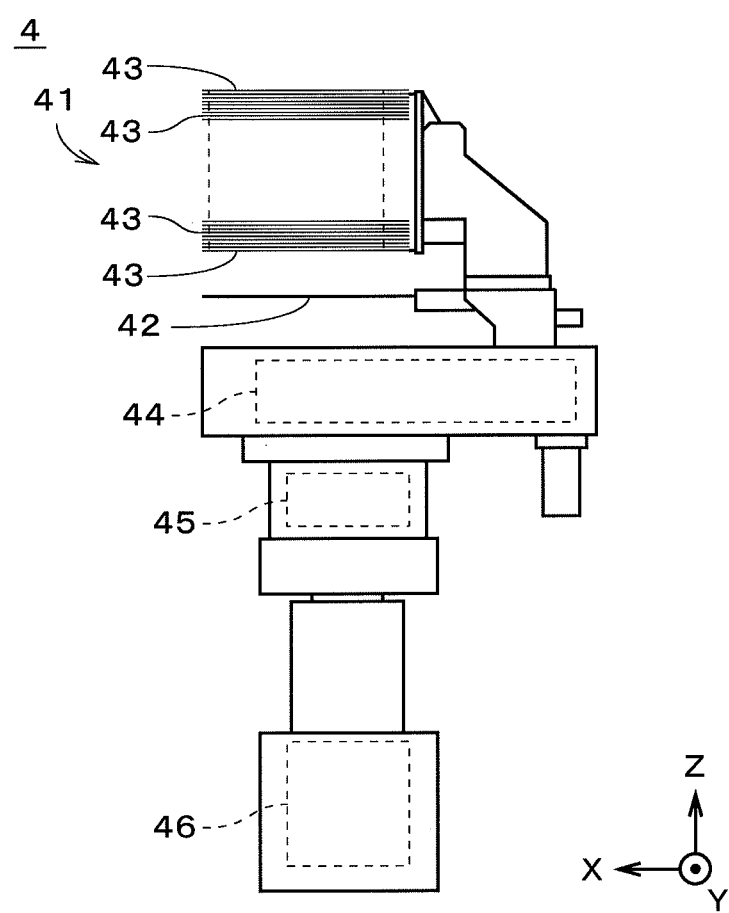
FIG. 6 is a side view of a carry-in-and-out mechanism.

Next, the carry-in-and-out mechanism 4 of the substrate processing apparatus 10 will be described. FIG. 6 is a side view of the carry-in-and-out mechanism 4. The carry-in-and-out mechanism 4 includes the batch hand 41, the single-substrate hand 42, a hand advancing and retracting mechanism 44, a hand turning mechanism 45, and a hand elevating mechanism 46. The hand advancing and retracting mechanism 44 individually moves the batch hand 41 and the single-substrate hand 42 in the horizontal direction. The hand turning mechanism 45 individually rotates the batch hand 41 and the single-substrate hand 42 in the horizontal direction. The hand elevating mechanism 46 individually moves the batch hand 41 and the single-substrate hand 42 in the up-down direction.

Figure 7:
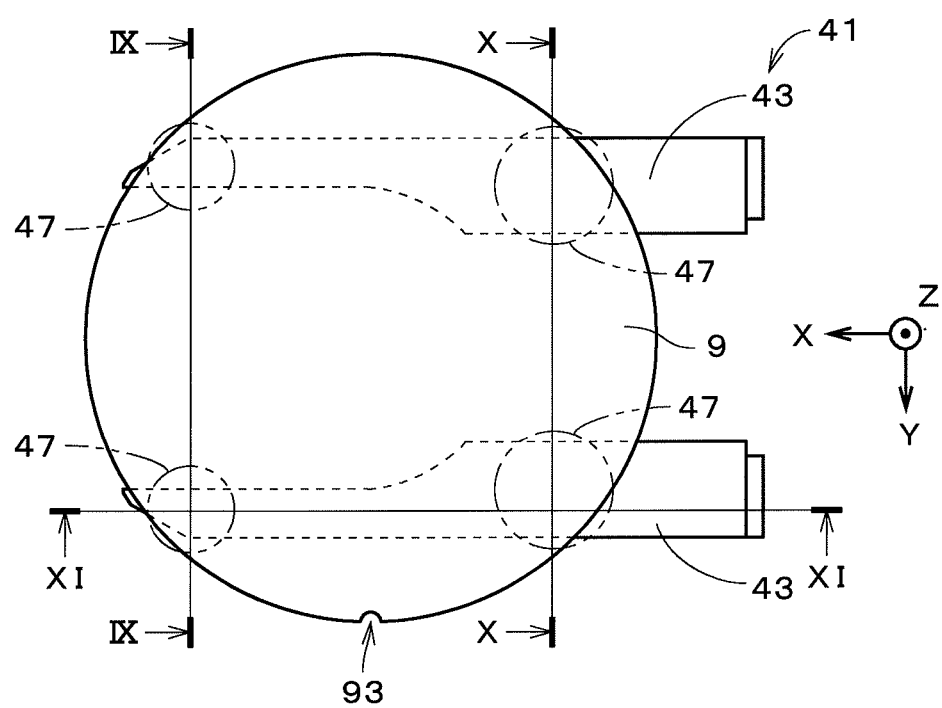
FIG. 7 is a plan view of a batch hand and a substrate.

FIG. 7 is a plan view of a substrate 9 held in a horizontal posture by the batch hand 41. As illustrated in FIGS. 6 and 7, the batch hand 41 includes a plurality of pairs of hand elements 43 that correspond respectively to a plurality of substrates 9. These pairs of hand elements 43 are aligned in the up-down direction (i.e., Z direction). Each pair of hand elements 43 supports the lower surface of each substrate 9 held in horizontal posture, from the underside.

Each hand element 43 is a member that extends approximately in the X direction. More specifically, each hand element 43 is a plate-like member having a generally strip shape in plan view. Each two hand elements 432 are arranged side by side in the Y direction. The hand elements 43 are support arms that support the substrates 9 held in a horizontal posture from the underside. A substrate 9 is placed in a horizontal posture on two hand elements 43 without being adsorbed by the batch hand 41. The carry-in-and-out mechanism 4 is a transport mechanism for transporting a plurality of substrates 9 that are placed in a horizontal posture.

The two hand elements 43 have four supporters 47 that oppose the lower surface of the peripheral portion of the substrate 9 in the up-down direction. In FIG. 7, the four supporters 47 are enclosed with dashed double-dotted lines. The four supporters 47 are located at the positions of intersections of the peripheral portion of the substrate 9 and the two hand elements 43 in plan view.

Figure 8:
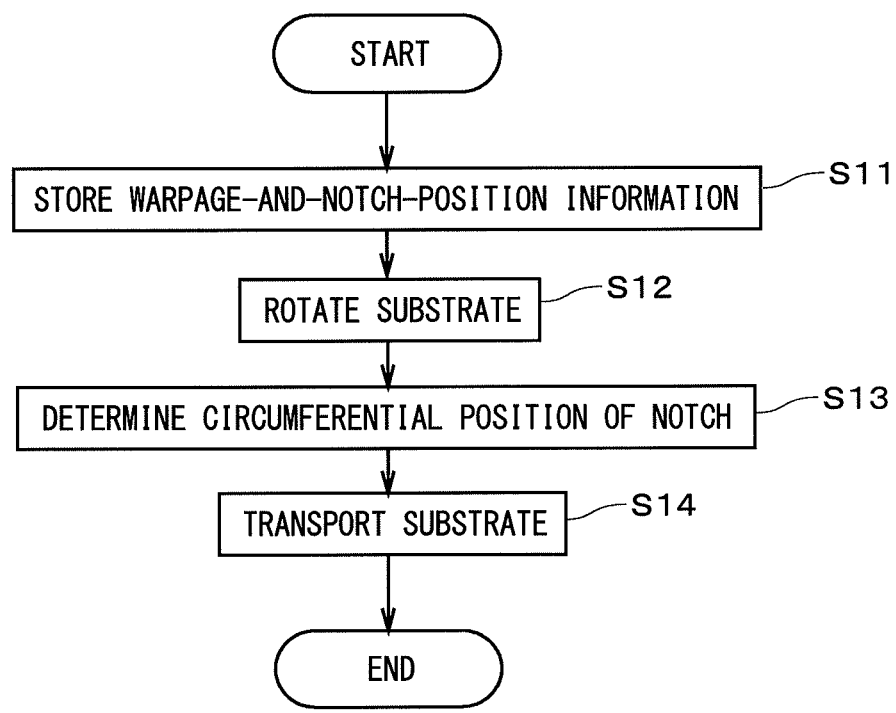
FIG. 8 is a flowchart illustrating a procedure for aligning and transporting substrates.

Next, a procedure for aligning the substrates 9 by the notch aligner 203 and transporting the substrates 9 by the carry-in-and-out mechanism 4 will be described with reference to the flowchart in FIG. 8. In the substrate processing apparatus 10 illustrated in FIG. 1, first, "warpage-and-notch-position information" is input to and stored in the storage 101 in advance before the notch aligner 203 determines the circumferential positions of a plurality of substrates 9 (step S11). The warpage-and-notch-position information includes a plurality of combinations of a warped state, which is common to a plurality of substrates 9, and a notch position at which the substrates 9 in the above warped state are in a proper posture when placed in a horizontal posture on the carry-in-and-out mechanism 4.

The notch position refers to the position in the circumferential direction of the notch 93 of the substrate 9. For example, a reference notch position (i.e., 0° notch position) of the substrate 9 in a horizontal posture may indicate a state in which the notch 93 is located at the position farthest on the +Y side from the two hand elements 43 as illustrated in FIG. 7. When the notch 93 is away in the circumferential direction from the reference position, an angle in the counterclockwise direction between the reference position and the notch 93 when the substrate 9 is viewed from above (i.e., on the +Z side) is referred to as a "notch position."

A combination of the warped state and the notch position included in the warpage-and-notch-position information may be a combination of a code (e.g., numeric or symbol) that indicates the warped state of the substrate 9 illustrated in FIG. 4 or 5 and the angle that indicates the notch position. The notch position refers to the position of the notch 93 when the substrate 9 in the warped state illustrated in FIG. 4 or 5 is rotated in the circumferential direction such that the lower surface of the substrate 9 comes into contact with the four supporters 47 of the pair of hand elements 43, while being placed in a horizontal posture on the pair of hand elements 43.

Figure 9:
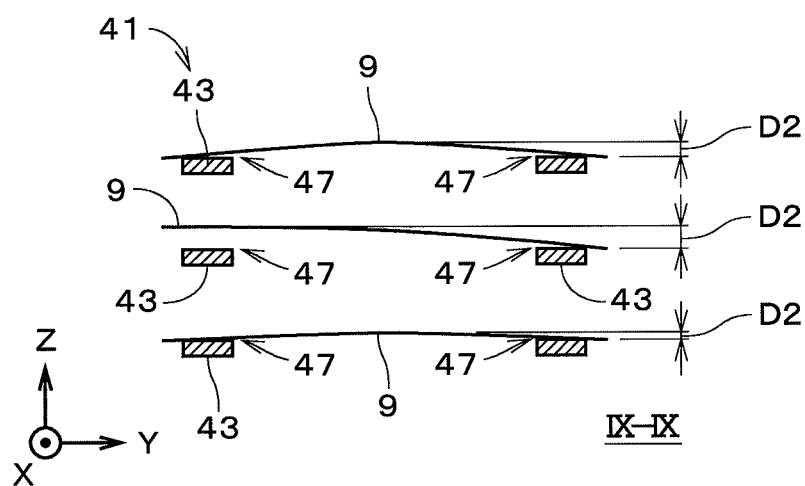
FIG. 9 is a cross-sectional view of substrates held in a horizontal posture.
Figure 10:
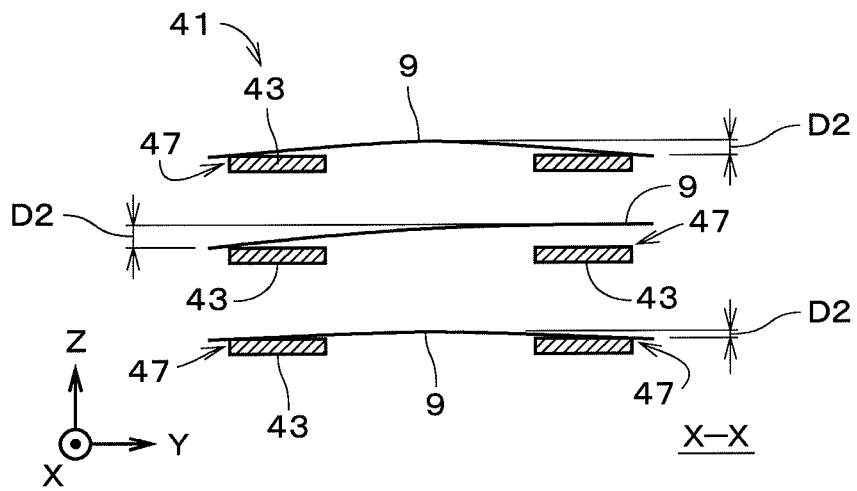
FIG. 10 is a cross-sectional view of the substrates held in a horizontal posture.

FIGS. 9 and 10 are cross-sectional views illustrating a state in which substrates 9 in the warped state illustrated in FIG. 4 are supported in a horizontal posture from the underside by the batch hand 41 (i.e., placed on the batch hand 41). FIG. 9 illustrates a cross-section taken at a position along line IX-IX in FIG. 7, and FIG. 10 illustrates a cross-section taken at a position along line X-X in FIG. 7. In other words, FIGS. 9 and 10 illustrate cross-sections along the four supporters 47 of the pair of hand elements 43. In FIGS. 9 and 10, it is assumed that the batch hand 41 simultaneously holds three substrates 9 having notches located at different notch positions. The uppermost substrates 9 in FIGS. 9 and 10 show a state in which the notch 93 is located at the reference position (i.e., 0° notch position). The substrates 9 in the center in FIGS. 9 and 10 show a state in which the notch is located at a 45° notch position. The lowermost substrates 9 in FIGS. 9 and 10 show a state in which the notch is located at a 90° notch position.

In the example illustrated in FIGS. 9 and 10, when the notch is located at the 90° notch position, the lower surface of the substrate 9 placed on the pair of hand elements 43 is in contact with the four supporters 47 of the pair of hand elements 43. When the notch is located at the 90° notch position, a distance D2 in the thickness direction between the top of the substrate 9 held in a horizontal posture and an area of contact of the peripheral portion of the substrate 9 with any supporter 47 is the smallest. When the notch is located at the 0° notch position, the lower surface of the substrate 9 is also in contact with the four supporters 47. When the notch is located at the 0° notch position, the distance D2 is the next smallest after the distance D2 in the case where the notch is located at the 90° notch position.

On the other hand, when the notch is located at the 45° notch position, out of the two supporters 47 located on the +X side of the pair of hand elements 43, the supporter 47 on the +Y side is in contact with the lower surface of the substrate 9, but the supporter 47 on the −Y side is not in contact with the lower surface of the substrate 9. Out of the two supporters 47 located on the −X side of the pair of hand elements 43, the supporter 47 on the −Y side is in contact with the lower surface of the substrate 9, but the supporter 47 on the +Y side is not in contact with the lower surface of the substrate 9. When the notch is located at the 45° notch position, the aforementioned distance D2 is the largest.

The warpage-and-notch-position information includes, for example, a combination of the code that indicates the warped state of the substrate 9 illustrated in FIG. 4 and the 90° notch position. The warpage-and-notch-position information also includes, for example, a combination of the code that indicates the warped state of the substrate 9 illustrated in FIG. 4 and the 0° notch position.

In the notch aligner 203 illustrated in FIG. 1, the warped state, which is common to a plurality of substrates 9 conveyed into the substrate processing apparatus 10, is input and stored as input information about the warped state in the storage 101 after step S11. This input information may be a code that indicates the warped state of a plurality of substrates 9.

Next, the controller 100 controls the substrate transport robot 204 so that a first substrate 9 housed in the FOUP 95 placed on the FOUP placement area 202 is conveyed into the notch aligner 203, and the notch aligner 203 starts rotating this substrate 9 (step S12). Then, the controller 100 controls the motor 203a on the basis of the position of the notch 93, which is detected by the notch position sensor 203b, the aforementioned input information, and the warpage-and-notch-position information. Thus, the circumferential position of the notch 93 of the substrate 9 is changed and set to the desired position. More specifically, the notch position sensor 203b detects the notch 93 of the rotating substrate 9, and the motor 203a is stopped with predetermined timing after the detection. The timing of stopping the motor 203a is determined by the controller 100 on the basis of the aforementioned input information and the warpage-and-notch-position information.

More specifically, the controller 100 extracts a notch position that corresponds to the warped state of the substrate 9 indicated by the input information, from the above plurality of combinations included in the warpage-and-notch-position information. Then, the substrate 9 is rotated until the position of the notch 93 of the substrate 9 matches the extracted notch position. When the position of the notch 93 has matched the extracted notch position, the rotation of the substrate 9 is stopped, and the circumferential position of the notch 93 of the substrate 9 is determined (step S13). The substrate 9 for which the position of the notch 93 has been determined is returned to the FOUP 95 on the FOUP placement area 202 by the substrate transport robot 204. By repeating the above processing in steps S12 and S13 for all of the substrates 9 housed in the FOUP 95 on the FOUP placement area 202, all of the substrates 9 housed in this FOUP 95 are sequentially aligned, with the position of the notch 93 of each substrate 9 matching the notch position extracted by the controller 100. In the substrate processing apparatus 10, the notch aligner 203, the storage 101, and the controller 100 constitute a substrate alignment apparatus that aligns a plurality of substrates 9 each having a notch 93 in the peripheral portion. Note that the FOUP 95 on the FOUP placement area 202 and the substrate transport robot 204 may also be regarded as part of the substrate alignment apparatus.

The FOUP 95 that houses a plurality of substrates 9 aligned by the substrate alignment apparatus is moved from above the FOUP placement area 202 to the FOUP holder 1 and placed on the FOUP holder 1 by the second FOUP transfer robot 207. Thereafter, the substrates 9 are transferred in a horizontal posture from the FOUP 95 to the carry-in-and-out mechanism 4 illustrated in FIG. 6, and placed on the carry-in-and-out mechanism 4. More specifically, each substrate 9 is placed on each pair of hand elements 43 of the batch hand 41. The lower surface of each substrate 9 placed on each pair of hand elements 43 is in contact with the aforementioned four supporters 47, because the circumferential position of the notch 93 of the substrate 9 is already set to the desired notch position by the notch aligner 203 in step S13 as described above. This configuration prevents or suppresses the occurrence of rattling or misalignment of each substrate 9 during transport of the substrate 9 by the carry-in-and-out mechanism 4, and thereby enables stable transport of the substrates 9. In the substrate processing apparatus 10, the carry-in-and-out mechanism 4, the notch aligner 203, the controller 100, and the storage 101 constitute a substrate transporter that transports the substrates 9. Note that the FOUP 95 on the FOUP placement area 202 and the substrate transport robot 204 may also be regarded as part of the substrate transporter. The second FOUP transfer robot 207 may also be regarded as part of the substrate transporter.

Figure 11:
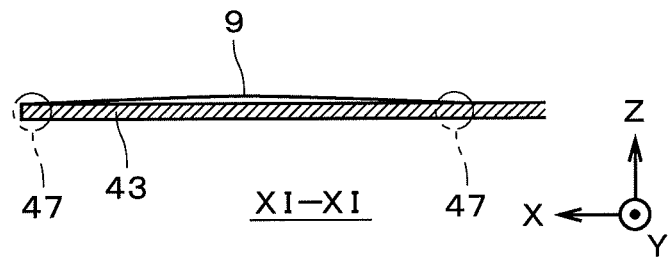
FIG. 11 is a cross-sectional view of a substrate held in a horizontal posture.

FIG. 11 is a cross-sectional view of a hand element 43 and a substrate 9, taken at a position along line XI-XI in FIG. 7. In the example illustrated in FIG. 11, the substrate 9 is convex upward between the two supporters 47 of the hand element 43 and vertically upward of the hand element 43 (i.e., on the +Z side). Although not shown, the substrate 9 is also convex upward between the two supporters 47 of the other hand element 43 and vertically upward of the other hand element 43.

Figure 12:
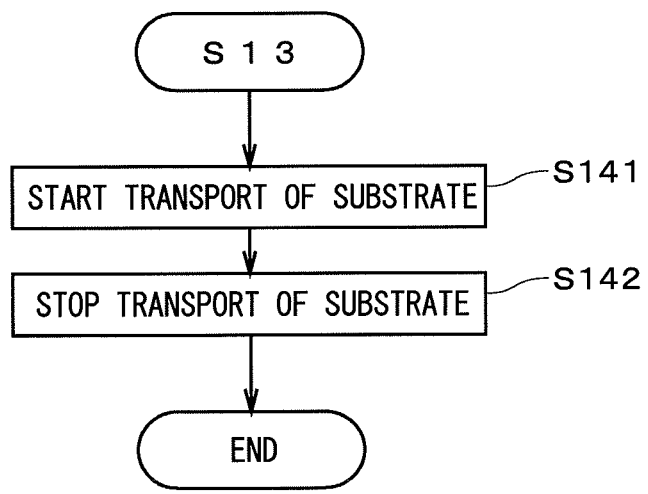
FIG. 12 is a flowchart illustrating a procedure for transporting substrates.

The plurality of substrates 9 placed in a horizontal posture on the batch hand 41 are transported to the position changing mechanism 5 by driving the hand turning mechanism 45 and the hand advancing and retracting mechanism 44 (step S14). The hand elevating mechanism 46 may also be driven as necessary for transport of the substrates 9. FIG. 12 illustrates a detailed procedure performed in step S14. In step S14, first, the movement of the batch hand 41 is started and accelerated (step S141). When the batch hand 41 approaches the position changing mechanism 5, the batch hand 41 is deaccelerated, and the movement of the batch hand 41 is stopped (step S142).

During transport of the substrate 9 in step S14, the controller 100 controls the carry-in-and-out mechanism 4 to control the acceleration at the time of starting and stopping the movement of the carry-in-and-out mechanism 4. More specifically, the controller 100 controls the hand advancing and retracting mechanism 44 on the basis of the aforementioned input information (i.e., information indicating the warped state that is common to a plurality of substrates 9) stored in the storage 101 so as to determine the acceleration at the time of starting the movement of the batch hand 41 in step S141. For example, when the distance D2 estimated from the above input information is greater than a predetermined threshold value, it is determined that the stability of the substrates 9 on the batch hand 41 may deteriorate during transport, and accordingly, the acceleration at the time of starting the movement is set to be lower than the normal acceleration. The acceleration at the time of stopping the movement of the batch hand 41 in step S142 is also set in the same manner. This improves the stability of transport of the substrates 9 by the carry-in-and-out mechanism 4. In the carry-in-and-out mechanism 4, the controller 100 may also control the acceleration at the time of starting and stopping the movement of the hand turning mechanism 45 or the hand elevating mechanism 46 on the basis of the warped state of the substrates 9, in the same manner as in the case of the hand advancing and retracting mechanism 44.

As described above, the aforementioned substrate transporter includes the carry-in-and-out mechanism 4 that is a transport mechanism, the notch aligner 203 that is a notch-position changing mechanism, the storage 101, and the controller 100. The carry-in-and-out mechanism 4 transports substrates 9 placed in a horizontal posture. The notch aligner 203 rotates substrates 9 that are to be placed on the carry-in-and-out mechanism 4, in the circumferential direction to change the circumferential positions of the notches 93 provided in the peripheral portions of the substrates 9. The storage 101 stores the warpage-and-notch-position information. The warpage-and-notch-position information includes a plurality of combinations of the warped state of the substrates 9 and the notch position at which the substrates 9 in this warped state are in a proper posture when placed on the carry-in-and-out mechanism 4. The controller 100 controls the notch aligner 203. The carry-in-and-out mechanism 4 includes four supporters 47 that oppose the lower surface of the peripheral portion of each substrate 9.

In the substrate transporter, the controller 100 controls the notch aligner 203 on the basis of the input information that is input about the warped state of the substrates 9 and the warpage-and-notch-position information, so as to determine the circumferential positions of the notches 93 of the substrates 9. Thus, the lower surface of each substrate 9 placed on the carry-in-and-out mechanism 4 comes into contact with the four supporters 47 of the carry-in-and-out mechanism 4. As a result, it is possible to prevent or suppress the occurrence of rattling or misalignment of the substrates 9 during transport of the substrates 9 by the carry-in-and-out mechanism 4, and thereby enable stable transport of the substrates 9.

In the substrate transporter, the carry-in-and-out mechanism 4 includes two hand elements 43. Each of the two hand elements 43 has two supporters 47 provided thereon among the aforementioned four supporters 47. A substrate 9 placed on the carry-in-and-out mechanism 4 is convex upward between the two supporters 47 on each hand element 43 and vertically upward of each hand element 43. Thus, the lower surface of the substrate 9 can suitably come into contact with the two supporters 47 of each hand element 43. As a result, it is possible to improve the stability of transport of the substrates 9 by the carry-in-and-out mechanism 4.

In the substrate transporter, the controller 100 controls the carry-in-and-out mechanism 4 on the basis of the warped state of the substrates 9 so as to control the acceleration at the time of starting and stopping the movement of the carry-in-and-out mechanism 4. Thus, as described above, it is possible to improve the stability of transport of the substrates 9 by the carry-in-and-out mechanism 4.

The aforementioned substrate transporter may transport a single substrate 9 or may transport a plurality of substrates 9 at once. When the substrate transporter transports a plurality of substrates 9 at once, the carry-in-and-out mechanism 4 also transports other substrates 9 along with the aforementioned single substrate 9. The notch aligner 203 sequentially rotates the other substrates 9 and the signal substrate 9 in the circumferential direction to change the circumferential positions of the notches 93 provided in the peripheral portions of the other substrates 9 in the same manner as in the case of the single substrate 9. The carry-in-and-out mechanism 4 includes another four supporters 47 that oppose the lower surface of each of the other substrates 9. The lower surface of the peripheral portion of each of the other substrates 9 placed on the carry-in-and-out mechanism 4 comes into contact with the other four supporters 47 of the carry-in-and-out mechanism 4. This configuration prevents or suppresses the occurrence of rattling or misalignment of the substrates 9 during transport of the substrates 9 by the carry-in-and-out mechanism 4. As a result, it is possible to stably transport the substrates 9. The controller 100 controls the carry-in-and-out mechanism 4 on the basis of the warped state of the substrates 9 so as to control the acceleration at the time of starting and stopping the movement of the carry-in-and-out mechanism 4. This improves the stability of transport of the substrates 9 by the carry-in-and-out mechanism 4.

The substrate transporter and the substrate processing apparatus 10 described above may be modified in various ways.

The notch aligner 203 may be a device having any of various types of structures as long as it is capable of changing the circumferential positions of the notches 93 by rotating the substrates 9 in the circumferential direction. For example, the notch aligner 203 may be a mechanism for rotating a plurality of substrates 9 simultaneously in the circumferential direction to determine the circumferential positions of the notches 93 of the substrates 9. That is, the motor 203a of the notch aligner 203 may be a rotator that rotates a plurality of substrates 9 either sequentially or simultaneously in the circumferential direction. In either case, the carry-in-and-out mechanism 4 is capable of stably transporting a plurality of substrates 9 as described above. The notch aligner 203 may also be a mechanism for rotating substrates 9 in a vertical posture either sequentially or simultaneously in the circumferential direction to change the circumferential orientations of the substrates 9. Moreover, the notch aligner 203 may cause the notches 93 of the substrates 9 to engage with a predetermined engagement shaft in order to stop the rotation of the substrates 9.

For example, the substrate transporter (i.e., the carry-in-and-out mechanism 4, the notch aligner 203, the storage 101, and the controller 100) does not necessarily have to control the acceleration of the carry-in-and-out mechanism 4 in step S14 as long as the notch aligner 203 determines the positions of the notches 93 and thereby the lower surface of each substrate 9 placed on the carry-in-and-out mechanism 4 comes into contact with the four supporters 47 of the carry-in-and-out mechanism 4.

The substrate processing apparatus 10 does not necessarily have to determine the positions of notches 93 before transport of substrates 9. In the case where the determination of the positions of notches 93 is omitted, the lower surface of each substrate 9 placed on the carry-in-and-out mechanism 4 does not necessarily have to come into contact with all of the four supporters 47 of the carry-in-and-out mechanism 4. In this case, the notch aligner 203 may be omitted, and the aforementioned substrate transporter may include only the carry-in-and-out mechanism 4 that is a transport mechanism and the controller 100. The carry-in-and-out mechanism 4 transports a single or a plurality of substrates 9 placed in a horizontal posture. The controller 100 controls the carry-in-and-out mechanism 4 on the basis of the warped state of the single or plurality of substrates 9 so as to control the acceleration at the time of starting and stopping the movement of the carry-in-and-out mechanism 4. More specifically, for example when it is determined on the basis of the warped state of a substrate 9 that the lower surface of a substrate 9 is not in contact with one or two of the four supporters 47, the acceleration at the time of starting and stopping the movement of the carry-in-and-out mechanism 4 is set to be lower than the normal acceleration. This configuration prevents or suppresses the occurrence of rattling or misalignment of the single or plurality of substrates 9 during transport by the carry-in-and-out mechanism 4, as described above. As a result, it is possible to stably transport the single or plurality of substrates 9.

The aforementioned substrate transporter may be used as a device independent of the other configuration of the substrate processing apparatus 10. Alternatively, the substrate transporter may be incorporated into and used in any of various apparatuses other than the aforementioned substrate processing apparatus 10.

The substrate processing apparatus 10 may be used to process glass substrates used in display devices such as liquid crystal displays, plasma displays, and field emission displays (FEDs), instead of semiconductor substrates. The substrate processing apparatus 10 may also be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit under 35 U.S.C. Section 119 of Japanese Patent Application No. 2016-190861 filed in the Japan Patent Office on Sep. 29, 2016, the entire disclosure of which is incorporated herein by reference.

REFERENCE SIGNS LIST

4 Carry-in-and-out mechanism
9 Substrate
43 Hand element
47 Supporter
93 Notch
100 Controller
101 Storage
203 Notch aligner
S11 to S14, S141, S142 Step

The invention claimed is:
1. A substrate transporter comprising:
a transport mechanism for transporting a substrate that is placed in a horizontal posture, said transport mechanism including a support arm that supports said substrate, and four supporters that are provided on said support arm so as to oppose a lower surface of a peripheral portion of said substrate;
a notch-position changing mechanism for rotating said substrate that is to be placed on said transport mechanism, in a circumferential direction to change a position in said circumferential direction of a notch that is provided in said peripheral portion of said substrate;
a storage for storing warpage-and-notch-position information in advance of placing said substrate on said transport mechanism;
wherein
said warpage-and-notch-position information includes a plurality of pieces of combination information, each said piece of combination information being a combination of a warped state of said substrate and a notch position at which said substrate in said warped state is held in an optimal posture where said lower surface of said peripheral portion of said substrate and said four supporters of said transport mechanism are brought into contact with each other when said substrate is placed on said transport mechanism, said plurality of pieces of combination information being obtained by combining a plurality of warped states with a plurality of notch positions respectively, wherein said substrate in a warped state corresponding to a respective notch position is held in said optimal posture at said respective notch position; and a controller for controlling said notch-position changing mechanism, wherein said controller extracts a notch position from said warpage-and-notch-position information, said notch position corresponding to an input warped state of said substrate indicated by input information that is input about the warped state of said substrate, and said lower surface of said peripheral portion of said substrate that is placed on said transport mechanism and said four supporters of said transport mechanism are brought into contact with each other by said controller controlling said notch-position changing mechanism on the basis of said notch position extracted from said warpage-and-notch-position information to determine said position in said circumferential direction of said notch of said substrate for providing said optimal posture.

2. The substrate transporter according to claim 1, wherein said transport mechanism includes two hand elements, on each of which two supporters among said four supporters are provided, and said substrate that is placed on said transport mechanism is convex upward between said two supporters of each hand element and vertically upward of said each hand element.

3. The substrate transporter according to claim 2, wherein said transport mechanism transports another substrate along with said substrate, said notch-position changing mechanism rotates said another substrate and said substrate either sequentially or simultaneously in said circumferential direction to determine a position in said circumferential direction of a notch that is provided in a peripheral portion of said another substrate, in the same manner as in the case of said substrate, said transport mechanism includes another four supporters that oppose a lower surface of said peripheral portion of said another substrate, and said lower surface of said another substrate that is placed on said transport mechanism comes into contact with said another four supporters of said transport mechanism.

4. The substrate transporter according to claim 1, wherein said transport mechanism transports another substrate along with said substrate, said notch-position changing mechanism rotates said another substrate and said substrate either sequentially or simultaneously in said circumferential direction to determine a position in said circumferential direction of a notch that is provided in a peripheral portion of said another substrate, in the same manner as in the case of said substrate, said transport mechanism includes another four supporters that oppose a lower surface of said peripheral portion of said another substrate, and said lower surface of said another substrate that is placed on said transport mechanism comes into contact with said another four supporters of said transport mechanism.

5. The substrate transporter according to claim 1, wherein said substrate is curved in a first radial direction to one side in a thickness direction of said substrate with a first curvature, and said substrate is curved in a second radial direction orthogonal to said first radial direction to said one side in said thickness direction with a second curvature greater than said first curvature.

6. The substrate transporter according to claim 1, wherein said substrate is curved in a first radial direction to one side in a thickness direction of said substrate, and said substrate is curved in a second radial direction orthogonal to said first radial direction to the other side in said thickness direction.

7. A substrate transport method comprising:

a) storing warpage-and-notch-position information in advance of placing said substrate on a transport mechanism that includes a plurality of pieces of combination information, each said piece of combination information being a combination of a warped state of a substrate and a notch position, for placing said substrate in a horizontal posture on said transport mechanism including a support arm that supports said substrate, and four supporters that are provided on said support arm so as to oppose a lower surface of a peripheral portion of said substrate, said notch position being a position at which said substrate in said warped state is held in an optimal posture where said lower surface of said peripheral portion of said substrate and said four supporters of said transport mechanism are brought into contact with each other when said substrate is placed on said transport mechanism, said plurality of pieces of combination information being obtained by combining a plurality of warped states with a plurality of notch positions respectively, wherein said substrate in a warped state corresponding to a respective notch position is held in said optimal posture at said respective notch position;

b) rotating said substrate in a circumferential direction to determine a position in said circumferential direction of a notch that is provided in said peripheral portion of said substrate; and c) placing said substrate in a horizontal posture on said transport mechanism and transporting said substrate, wherein in said operation b), a notch position is extracted from said warpage-and-notch-position information, said notch position corresponding to an input warped state of said substrate indicated by input information that is input about the warped state of said substrate, and in said operation b), the position in said circumferential direction of said notch of said substrate is determined on the basis of said notch position extracted from said warpage-and-notch-position information, as a result of which said lower surface of said peripheral portion of said substrate that is placed on said transport mechanism comes into contact with said four supporters of said transport mechanism in said operation c).

* * * * *